(12) United States Patent
Kimura et al.

(10) Patent No.: US 6,579,370 B2
(45) Date of Patent: Jun. 17, 2003

(54) APPARATUS AND METHOD FOR COATING TREATMENT

(75) Inventors: Yoshio Kimura, Kikuchi-gun (JP); Seiki Ishida, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 111 days.

(21) Appl. No.: 09/852,176

(22) Filed: May 10, 2001

(65) Prior Publication Data

US 2002/0006577 A1 Jan. 17, 2002

(30) Foreign Application Priority Data

May 16, 2000 (JP) ........................................ 2000-143370

(51) Int. Cl.$^7$ ............................................... B05C 11/10
(52) U.S. Cl. ......................... 118/603; 118/610; 118/52; 118/56; 118/66; 118/319; 118/320; 427/240; 427/345
(58) Field of Search ............................ 118/52, 56, 59, 118/66, 319, 320, 603, 610; 427/240, 345

(56) References Cited

U.S. PATENT DOCUMENTS

| | | | | |
|---|---|---|---|---|
| 4,150,494 A | * | 4/1979 | Rothchild | ..................... 34/469 |
| 4,469,720 A | * | 9/1984 | Morris | ....................... 427/345 |
| 5,709,038 A | * | 1/1998 | Scheufler et al. | ............. 34/475 |
| 6,063,439 A | | 5/2000 | Semba et al. | ................ 427/240 |

\* cited by examiner

*Primary Examiner*—Laura Edwards
(74) *Attorney, Agent, or Firm*—Oblon, Spivak, McClelland, Maier & Neustadt, P.C.

(57) ABSTRACT

An apparatus for the coating treatment comprises a coating section for coating a substrate with a process solution, a heating section for heating the substrate coated with the process solution, and a recovery section for recovering at least a part of the solvent vapor contained in the hot exhaust gas discharged from the heating section. The recovery section includes a cooling apparatus, and the hot exhaust gas containing a solvent vapor generated from the substrate when the substrate is subjected to a heating treatment is passed through the cooling apparatus so as to cool and condense at least a part of the solvent vapor contained in the hot exhaust gas so as to recover the solvent in the form of a liquid.

17 Claims, 10 Drawing Sheets

APPARATUS AND METHOD FOR COATING TREATMENT

BACKGROUND OF THE INVENTION

1. Field of the Invention

The present invention relates to an apparatus and a method for the coating treatment in which a substrate such as a semiconductor wafer is coated with a resist solution, followed by subjecting the resist coating to a heat treatment.

2. Description of the Related Art

In the photolithography step included in, for example, the manufacturing process of a semiconductor device, a semiconductor wafer is coated with a resist, followed by exposing the formed resist film to light in a predetermined circuit pattern. Then, the light-exposed circuit pattern is subjected to a developing treatment so as to form a circuit pattern in the resist film.

In general, various heat treatments are performed in the photolithography step including, for example, the heat treatment after the resist coating step (pre-bake), the heat treatment after the light exposure step (post exposure bake), and the heat treatment after the developing step (post bake). In general, such a heat treatment of the resist is performed by using a hot plate unit including a casing and a heating plate (hot plate) heated by a heater and arranged within the casing.

In the pre-bake treatment, various solvents contained in the resist solution are evaporated so as to form a resist film. Various kinds of solvents are contained in the resist depending on the kind of the resist, and the solvents used include, for example, those having a low boiling point and a high vapor pressure and those having a high boiling point and a low vapor pressure. These solvent components were discharged to the outside in the past in the form of a vapor contained in the hot exhaust gas from the hot plate unit. For example, the hot exhaust gas containing the vapor of such a solvent was transferred to a processing apparatus equipped with, for example, scrubbers through, for example, the piping of the plant in which was arranged the coating apparatus equipped with the hot plate unit, and the solvent component was removed in the processing apparatus.

One of the reasons for employing the particular method is that, since the solvent component contained in the conventional resist has a low boiling point and a high vapor pressure in many cases, the solvent vapor is scarcely cooled and condensed into a liquid and, thus, the piping is less contaminated, even if the hot exhaust gas is circulated through the piping of the plant.

However, with the rapid progress in recent years in the degree of integration and performance of the semiconductor devices, various components meeting the object of the use and various solvents for dissolving these components have come to be used in respect of the resist used for forming the circuit pattern.

For example, NMP (normal methyl pyrrolidone) having a high boiling point and a low vapor pressure is used as a component of polyimide series resist. Such a component having a high boiling point does not form a dew while the hot exhaust gas discharged from the hot plate unit has a high temperature. However, if the component is naturally cooled during flow within the piping so as to lower the temperature of component to a level close to room temperature, the component forms a dew within the piping so as to clog the piping, leading to the problem that the exhaust function of the piping is lowered. The clogging brings about the problem that the maintenance cost of the plant piping is increased.

BRIEF SUMMARY OF THE INVENTION

An object of the present invention is to provide an apparatus and a method for the coating treatment, which prevent the solvent component of the hot exhaust gas discharged from the heating device from being condensed within the piping to form a dew.

According to a first aspect of the present invention, there is provided an apparatus for the coating treatment, in which a substrate is coated with a predetermined process solution, followed by applying a heat treatment to the resultant coating, comprising a coating section for coating the substrate with a process solution; a heating section for heating the substrate coated with said process solution; and a recovery section for recovering at least a part of the solvent vapor contained in the hot exhaust gas discharged from said heating section, wherein said recovery section includes a cooling apparatus for cooling and liquefying said solvent vapor for recovery of the liquefied solvent.

According to a second aspect of the present invention, there is provided a method for the coating treatment, in which a substrate having the surface coated with a predetermined process solution is arranged within a heating device for subjecting said substrate to a heat treatment within the heating device, comprising passing a hot exhaust gas containing a solvent vapor, which is generated from said process solution on the substrate when the substrate is arranged within said heating device, through a cooling apparatus such that at least a part of the solvent vapor contained in said exhaust gas is recovered as a liquid.

In the present invention, the hot exhaust gas discharged from the heating section (heating device) is cooled to a predetermined temperature so as to liquefy and remove the solvent vapor contained in the hot exhaust gas and, then, supplied to the piping of the plant, making it possible to suppress the dew formation within the piping of the plant. As a result, it is possible to carry out the heat treatment without lowering the exhaust function. It is also possible to lower the load required for the maintenance of the piping or the like of the plant. Further, the corrosion of the piping or the like of the plant caused by the solvent vapor or the like can be suppressed so as to prolong the life of the piping or the like of the plant. It is possible to control the removal rate of the solvent vapor by defining appropriately the construction, the scale, the cooling temperature, the hot exhaust gas flow rate, etc. of the cooling apparatus. In addition, the recovered solvent can be utilized again as a raw material. What should also be noted is that, if the cooling apparatus used is constructed to circulate at room temperature the cheap city water without using, for example, a chiller, the cost reduction can be achieved in respect of both the apparatus cost and the running cost.

DETAILED DESCRIPTION OF THE INVENTION

The coating apparatus and the coating method according to a preferred embodiment of the present invention, in which, for example, a semiconductor wafer is coated first with a resist and, then, a pre-bake is applied to the resist coating, will now be described with reference to the accompanying drawings. The resist coating-developing system equipped with the coating apparatus of the present invention will now be briefly described first.

Figure 1:
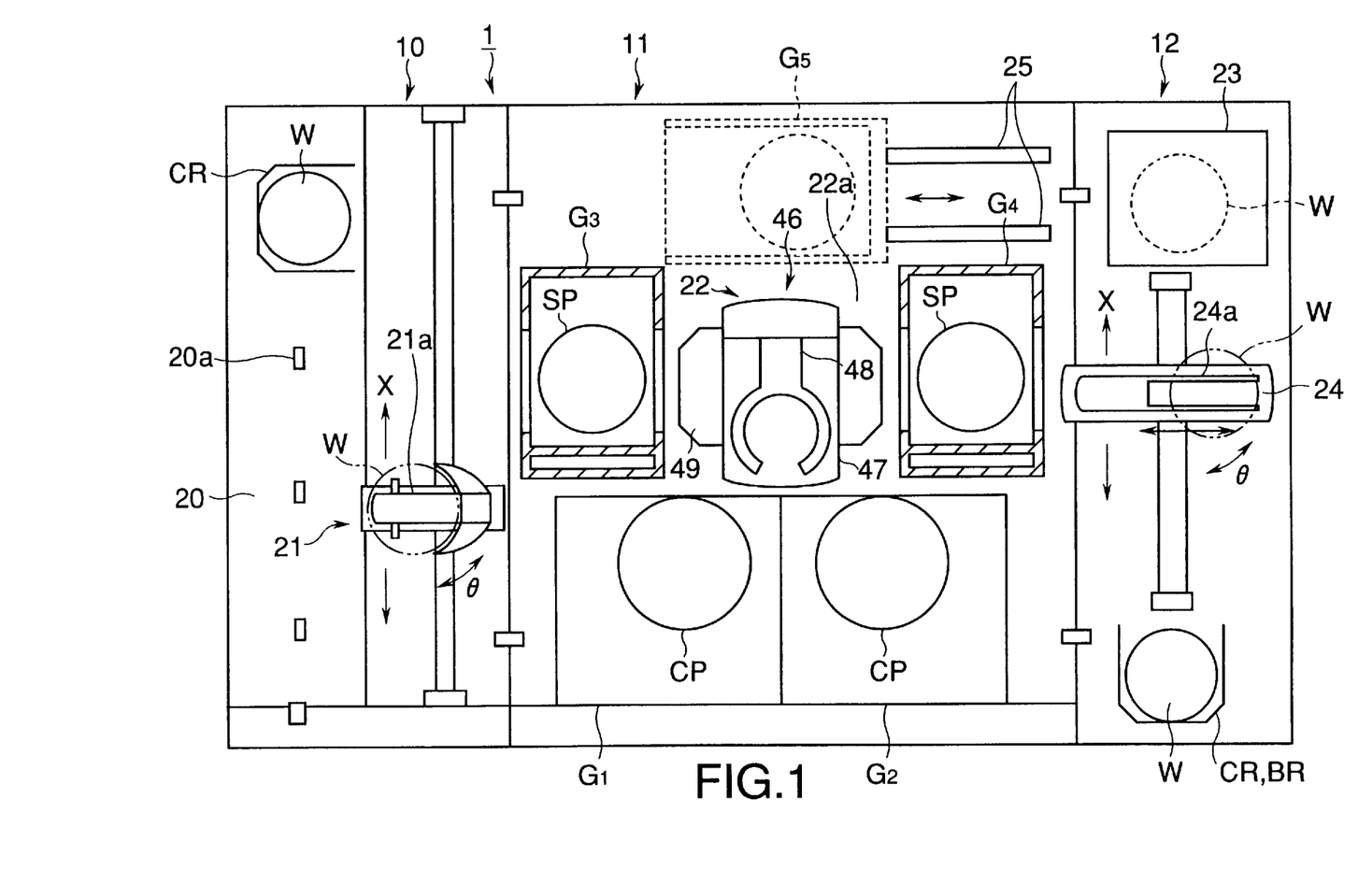
FIG. 1 is a plan view schematically showing the construction of a resist coating-developing system according to one embodiment of the coating apparatus of the present invention.
Figure 2:
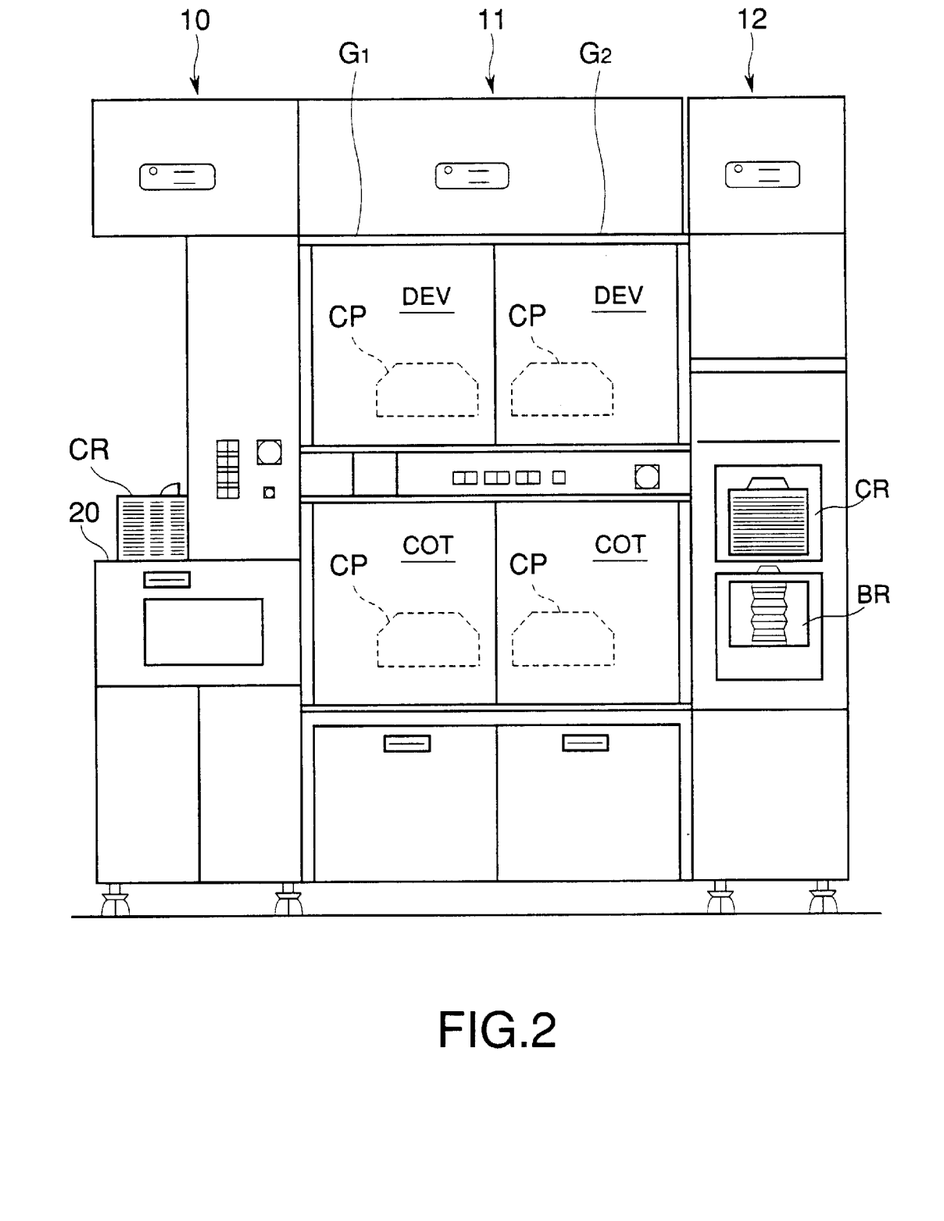
FIG. 2 is a front view schematically showing the construction of the resist coating-developing system shown in FIG. 1.
Figure 3:
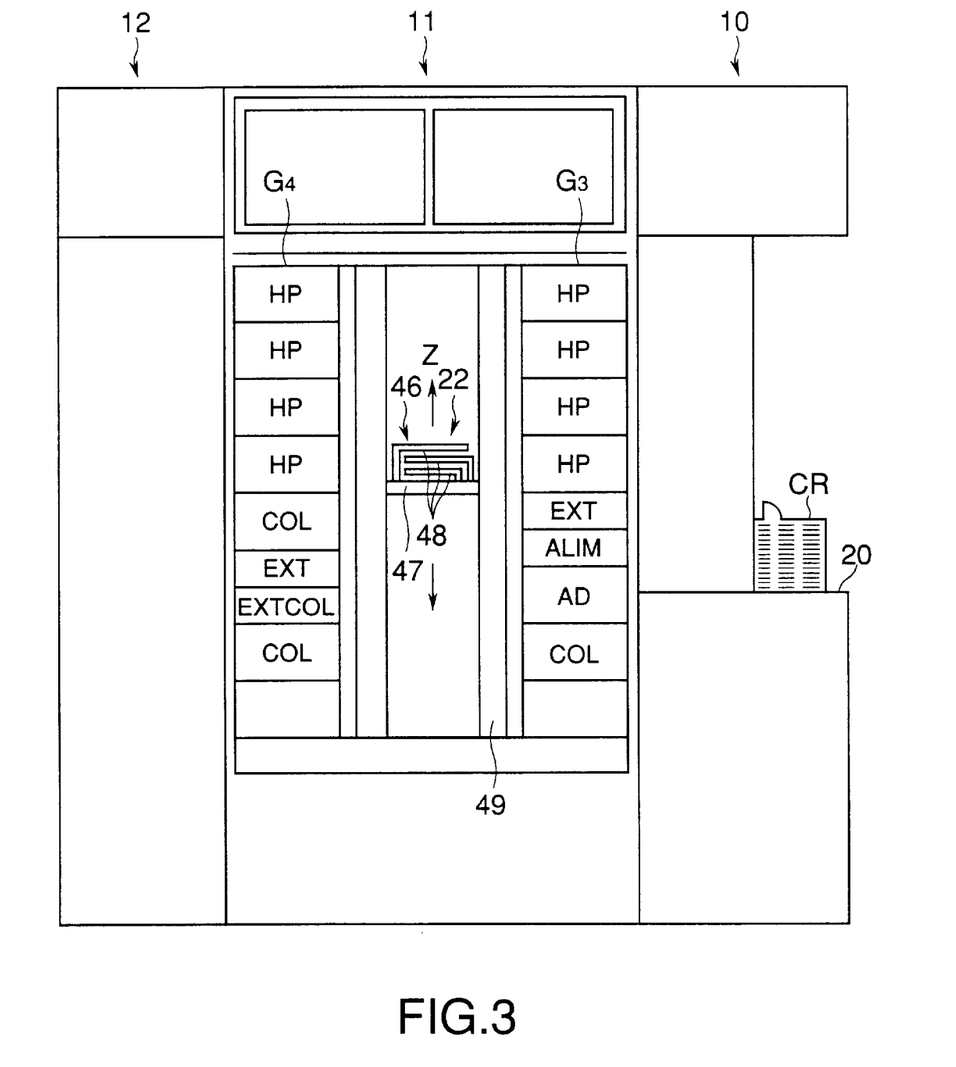
FIG. 3 is a back view schematically showing the construction of the resist coating-developing system shown in FIG. 1.

FIG. 1 is a plan view schematically showing the construction of a resist coating-developing system 1, and FIGS. 2 and 3 are a front view and a back view, respectively, of the resist coating-developing system shown in FIG. 1. As shown in the drawings, the resist coating-developing system 1 comprises a cassette station 10, which is a transfer station, a process station 11 having a plurality of process units, and an interface section 12 arranged adjacent to the process station 11 for transfer of wafers W between the process station 11 and an exposure apparatus (not shown).

The cassette station 10 is for transfer of wafers W between a wafer cassette CR having a plurality of semiconductor wafers, e.g., having 25 wafers W, housed therein as an object to be processed and the process station 11. For example, the wafers housed in the wafer cassette CR are transferred from another system into the resist coating-developing system 1 or from the resist coating-developing system 1 to another system via the cassette station 10.

As shown in FIG. 1, the cassette station 10 includes a wafer cassette table 20, and a plurality of positioning projections 20a are formed on the cassette table 20 in a manner to be arranged in the X-direction. In the embodiment shown in the drawing, four projections 20a are formed on the cassette table 20. It is possible for the wafer cassettes CR to be arranged in the positions of the projections 20a such that the wafer delivery ports of the wafer cassettes CR face the process station 11. Within each wafer cassette CR, the wafers are arranged in a vertical direction (Z-direction). The cassette station 10 also includes a wafer transfer mechanism 21 positioned between the wafer cassette table 20 and the process station 11.

The wafer transfer mechanism 21 includes a wafer transfer arm 21a movable both in the cassette arranging direction (X-direction) and in the wafer arranging direction (Z-direction) within the cassette CR. The wafer transfer arm 21a is capable of gaining access selectively to any of the wafer cassettes CR. Also, the wafer transfer arm 21a is swingable in a θdirection shown in FIG. 1 and, thus, is capable of gaining access to the alignment unit (ALIM) and an extension unit (EXT) belonging to a third process section $G_3$, which will be described herein later, on the side of the process station 11.

On the other hand, the process station 11 includes a plurality of process units for performing a series of steps in applying the coating-developing treatment to the wafer W. These process units are arranged at predetermined positions to form a multi-stage structure, and the wafers W are processed one by one in these process units. As shown in FIG. 1, a wafer transfer passageway 22a is formed in the central portion of the process station 11. A main wafer transfer mechanism 22 is arranged in the wafer transfer passageway 22a, and all the process units are arranged around the wafer transfer passageway 22a. These plural process units are divided into a plurality of process sections such that each process section includes a plurality of process units that are arranged one upon the other in the vertical direction (Z-direction).

As shown in FIG. 3, the main wafer transfer mechanism 22 includes a wafer transfer device 46 movable in the vertical direction (Z-direction) inside a cylindrical support body 49. The cylindrical support body 49 can be rotated by a rotary driving force of a motor (not shown), and the wafer transfer device 46 is interlocked with the cylindrical support body 49 so as to be also rotatable. The wafer transfer device 46 is provided with a plurality of holding members 48 movable in the front-rear direction of a transfer base 47. These holding members 48 permit delivering the wafer W among the process units.

As shown in FIG. 1, four process sections $G_1$, $G_2$, $G_3$ and $G_4$ are actually arranged in this embodiment around the wafer transfer passageway 22a, and it is possible to arrange a fifth process section $G_5$ as desired. The first and second process sections $G_1$ and $G_2$ are arranged on the front side of the resist coating-developing system 1, the third process section $G_3$ is arranged adjacent to the cassette station 10, and the fourth process section $G_4$ is arranged adjacent to the interface section 12. Further, it is possible to arrange the fifth process section $G_5$ on the rear side.

In the first process section $G_1$, a developing unit (DEV) for developing a resist pattern, which is a spinner type process unit, is arranged above a resist coating unit (COT), which is also a spinner type process unit, to form a two stage vertical structure. In each of these spinner type process units, a predetermined treatment is applied to the wafer W disposed on a spin chuck (not shown) within a coater cup (CP). Likewise, a developing unit (DEV), which is a spinner type process unit noted above, is arranged above a resist coating unit (COT), which is also a spinner type process unit noted above, in the second process unit $G_2$ to form a two stage vertical structure.

In the third process unit $G_3$, a plurality of oven type process units, in which a predetermined treatment is applied to the wafer W disposed on a table SP, are superposed one upon the other to form a multi-stage vertical structure, as shown in FIG. 3. To be more specific, the third process section $G_3$ comprises a cooling unit (COL) for applying a cooling treatment, an adhesion unit (AD) for applying a so-called "hydrophobic treatment" for improving the fixing properties of the resist, an aligning unit (ALIM) for performing the position alignment, an extension unit (EXT) for transferring the wafer W, and four hot plate units (HP) for applying a heat treatment to the wafer before an exposure treatment, after an exposure treatment and after the developing treatment. These eight process units are superposed one upon the other in the order mentioned to form an eight stage vertical structure. Incidentally, it is possible to arrange a cooling unit (COL) in place of the aligning unit (ALIM) to permit the cooling unit (COL) to perform the aligning function.

A plurality of oven type process units are vertically superposed one upon the other in the fourth process section $G_4$, too. To be more specific, a cooling unit (COL), an extension-cooling unit (EXTCOL), which is a wafer transfer section provided with a cooling plate, an extension unit (EXT), a cooling unit (COL), and four hot plate units (HP) are vertically superposed one upon the other in the order mentioned in the fourth process section $G_4$.

Where the fifth process section $G_5$ is arranged on the rear side of the main wafer transfer mechanism 22, the fifth process section $G_5$ is made movable along a guide rail 25 in the sideward direction as viewed from the main wafer transfer mechanism 22. It follows that, even where the fifth process section $G_5$ is arranged, it is possible to ensure a free space behind the main wafer transfer mechanism 22 by sliding the fifth process section $G_5$ along the guide rail 25, making it possible to apply a maintenance operation to the main wafer transfer mechanism 22 from behind the main wafer transfer mechanism 22.

The interface section 12 is equal to the process station 11 in the length in the X-direction. As shown in FIGS. 1 and 2, a movable pick-up cassette CR and a stationary buffer cassette BR are arranged one upon the other in the front portion of the interface section 12. A peripheral light exposure apparatus 23 is arranged in the rear portion of the interface section. Further, a wafer transfer mechanism 24 is arranged in the central portion of the interface section 12. The wafer transfer mechanism 24 has a wafer transfer arm 24a movable in both the X-direction and the Z-direction so as to gain access to the cassettes CR, BR and to the peripheral light exposure apparatus 23.

Incidentally, the wafer transfer arm 24a is swingable in the θdirection and, thus, is capable of gaining access to the extension unit (EXT) belonging to the fourth process section $G_4$ of the process station 11 and to a wafer delivery table (not shown) on the side of the adjacent light exposure apparatus.

In the resist coating-developing system 1 of the construction described above, the wafer transfer arm 21a of the wafer transfer mechanism 21 gains access to the wafer cassette CR housing unprocessed wafers W in the cassette station 10 so as to take out a single wafer W and, then, transfers the wafer W thus taken out into the extension unit (EXT) of the third process section $G_3$.

The wafer W is transferred by the wafer transfer device 46 of the main wafer transfer mechanism 22 from the extension unit (EXT) into the aligning unit (ALIM) of the third process section $G_3$ so as to be aligned and, then, further transferred into the adhesion unit (AD) for the hydrophobic treatment (HMDS treatment) for improving the fixing properties of the resist. Since the hydrophobic treatment involves heating, the wafer W is then transferred by the wafer transfer device 46 from the adhesion unit (AD) into the cooling unit (COL) for the cooling.

Incidentally, depending on the kind of the resist used, it is possible to omit the HMDS treatment so as to transfer the wafer W directly into the resist coating unit (COT). In the case of using, for example, a polyimide series resist, it is possible to transfer the wafer W directly into the resist coating unit (COT).

The wafer W cooled in the cooling unit (COL) after the treatment within the adhesion unit (AD) or the wafer W that was not subjected to the HMDS treatment in the adhesion unit (AD) is transferred by the wafer transfer device 46 into the resist coating unit (COT) for the resist coating to form a coated film. After completion of the coating treatment, the wafer W is subjected to a pre-bake treatment within any of the hot plate units (HP) included in the third process unit $G_3$ or fourth process unit $G_4$, and, then, cooled in any of the cooling units (COL).

The cooled wafer W is transferred into the aligning unit (ALIM) of the fourth process section $G_3$ so as to be aligned and, then, transferred into the interface section 12 through the extension unit (EXT) of the fourth process section $G_4$.

The wafer W is subjected to a peripheral light exposure by the peripheral light exposure apparatus 23 in the interface section 12 so as to have the excess resist removed and, then, transferred into a light exposure device (not shown) arranged adjacent to the interface section 12. In the light exposure device, the resist film formed on the wafer W is selectively exposed to light in a predetermined pattern.

The wafer W after the light exposure treatment is brought back again into the interface section 12 so as to be transferred by the wafer transfer mechanism 24 into the extension unit (EXT) belonging to the fourth process section $G_4$. Then, the wafer W is further transferred by the wafer transfer mechanism 46 into any of the hot plate units (HP) so as to be subjected to a post exposure bake treatment. Further, the wafer W is cooled in the cooling unit (COL).

Then, the wafer W is transferred into the developing unit (DEV) for the development of the light exposed pattern. After completion of the development, the wafer W is transferred to any of the hot plate units (HP) for the post bake treatment and, then, cooled in the cooling unit (COL). After completion of the series of operations described above, the wafer W is brought back to the cassette station 10 through the extension unit (EXT) of the third process unit $G_3$ so as to be housed in any of the wafer cassettes CR.

Figure 4:
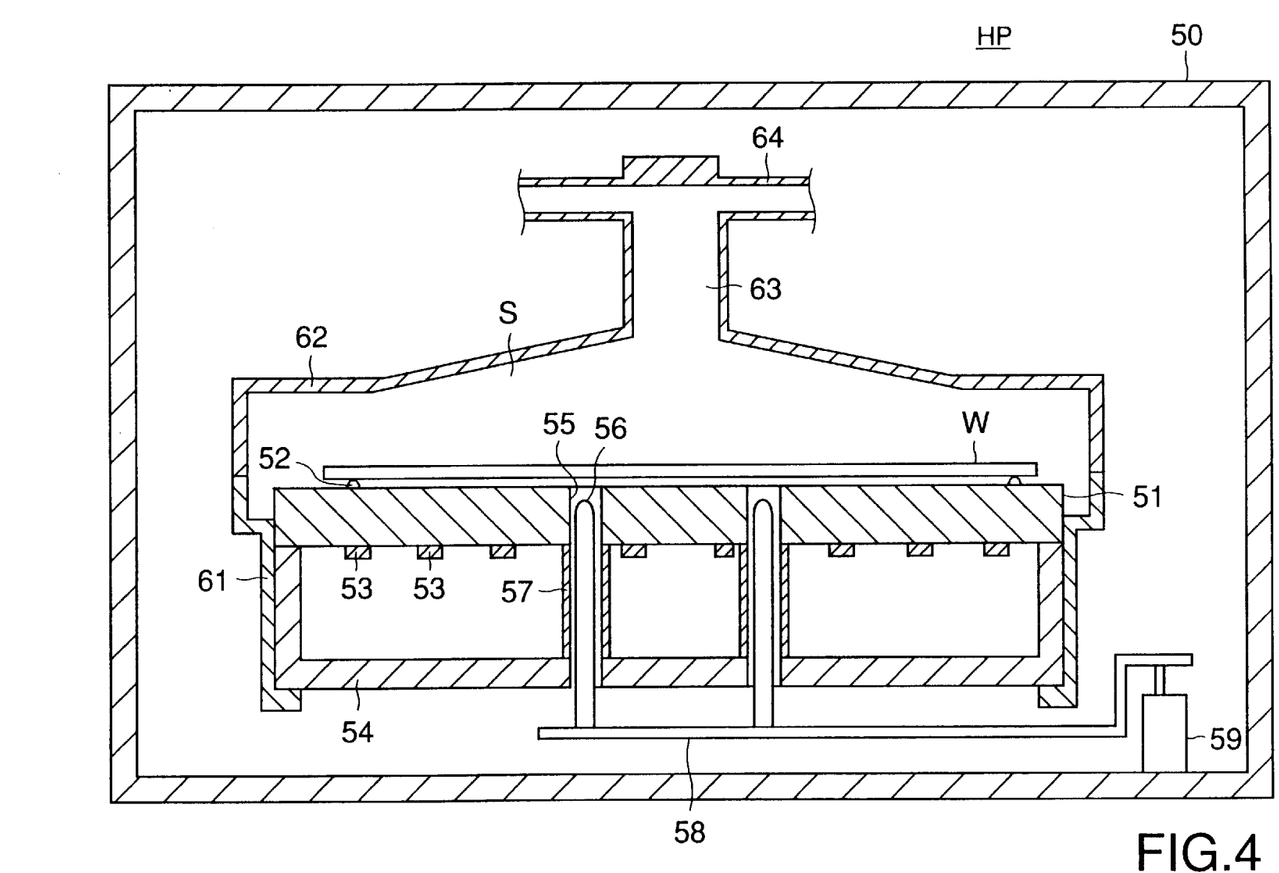
FIG. 4 is a cross sectional view schematically showing the construction of a hot plate unit used in the resist coating-developing system shown in FIG. 1.

The hot plate unit (HP) will now be described more in detail with reference to the cross sectional view of FIG. 4.

The hot plate unit (HP) comprises a casing 50. A disc-like heating plate 51 is arranged in a lower portion within the casing 50. The heating plate 51 is formed of, for example, aluminum, and proximity pins 52 are mounted to the surface of the heating plate 51. The wafer W is disposed on the proximity pins 52 so as to be positioned close to the heating plate 51. An electric heater 53 having a predetermined pattern is arranged on the back surface of the heating plate 51.

The heating plate 51 is supported by a hollow support member 54. Three through-holes 55 (two through-holes 55 alone being shown in the drawing) are formed in the central portion of the heating plate 51. Three vertically movable pins 56 for vertically moving the wafer W are arranged vertically movable within these through-holes 55. Also, a cylindrical guide member 57 contiguous to the through-hole 55 is arranged between the heating plate 51 and the bottom plate of the support member 54. The guide member 57 permits the vertically movable pins 56 to be moved up and down without being obstructed by, for example, the heater wiring arranged on the lower surface of the heating plate 51. These pins 56 are supported by a support plate 58, and the support plate 58 is moved up and down by a cylinder 59 arranged sideward of the support member 54. It follows that the vertically movable pins 56 are moved up and down by the cylinder 59 via the support plate 58.

A support ring 61 is arranged to surround and support the peripheries of the heating plate 51 and the support member 54, and a lid 62 movable in the vertical direction is mounted to the support ring 61. Under the state that the lid 62 is moved downward to reach the upper surface of the support ring 61, formed is a heat treating space S of the wafer W.

The lid 62 is formed conical such that the height of the lid 62 is gradually increased from the outer periphery toward the central portion. An exhaust port 63 having an exhaust pipe 64 connected thereto is formed in the central top portion of the lid 62 such that the space S for the heat treatment is exhausted through these exhaust port 63 and the exhaust pipe 64.

In the hot plate unit (HP) of the construction described above, the wafer W is introduced into the casing 50 under the state that the lid 62 is held elevated. Then, the wafer W is disposed on the vertically movable pins 56 that are held projected upward, followed by moving downward the vertically movable pins 56 so as to permit the wafer W to be supported by the proximity pins 52. Then, the lid 62 is moved downward, and a heat treatment is applied to the wafer W within the space S for the heat treatment while exhausting the solvent vapor evaporated from the resist film formed on the wafer W through the exhaust port 63 and the exhaust pipe 64.

It was customary in the past that the solvent vapor contained in the hot exhaust gas discharged from the hot plate unit (HP) through the exhaust pipe 64 was transferred through the piping of the plant into a cleaning apparatus equipped with, for example, scrubbers for removal of the solvent vapor. However, various kinds of processing solutions such as the resist solutions have come to be used for the liquid treatment of the wafer W. What should be noted is that the vapors of some of these processing solutions are liquefied to form a dew during passage of these vapors through the piping of the plant, with the result that the liquefied vapors are allowed to remain within the piping of the plant. Such being the situation, a cooling apparatus is arranged in the present invention between the exhaust pipe 64 and the piping of the plant. In the present invention, the hot exhaust gas discharged from within the hot plate unit (HP) through the exhaust pipe 64 is cooled in the cooling apparatus so as to remove and recover a predetermined amount of the solvent vapor contained in the hot exhaust gas in the form of a liquid.

Figure 5:
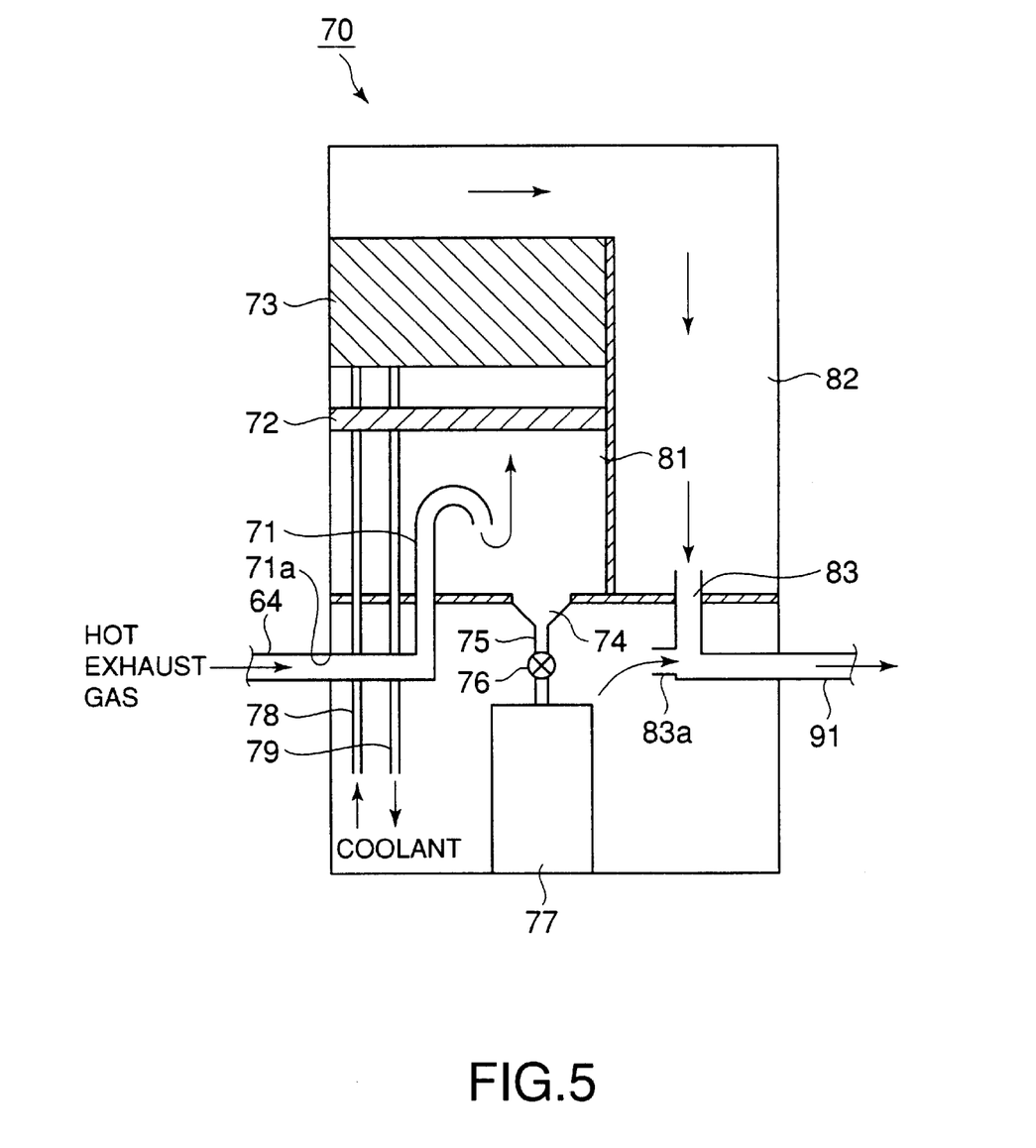
FIG. 5 is a cross sectional view schematically showing the construction of a cooling apparatus used in the resist coating-developing system shown in FIG. 1.

FIG. 5 shows a cooling apparatus 70 according to one embodiment of the present invention. As shown in the drawing, the cooling apparatus 70 comprises a demister 72 for removing the mist, etc. contained in the hot exhaust gas, a cooling coil 73 for cooling the hot exhaust gas so as to liquefy the solvent contained in the hot exhaust gas, and a recovery tank 77 for recovering the liquefied solvent or the like.

The exhaust pipe 64 of the hot plate unit (HP) is connected to an aperture portion 71a formed in the side wall of the cooling apparatus 70. Arranged within the cooling apparatus 70 is an exhaust pipe 71 extending from the aperture portion 71a into a process chamber 81 through the bottom wall of the process chamber 81 so as to introduce the hot exhaust gas flowing through the exhaust pipe 64 into the process chamber 81. The exhaust pipe 71 extends upward into the process chamber 81 through the bottom wall of the process chamber 81 and, then, is bent downward so as to prevent the liquid material, which drops from the demister 72 and the cooling coil 73 onto the bottom wall of the process chamber 82, from flowing into the exhaust pipe 71.

The hot exhaust gas discharged from the exhaust pipe 71 into the process chamber 81 passes first through the demister 72. Most of mist and solvent vapor contained in the hot exhaust gas are liquefied by attaching to the demister 72. The liquefied mist and solvent vapor attached to the demister 72 drop onto bottom wall of the process chamber 81 by their own weights.

As described above, the mist and the solvent vapor contained in the hot exhaust gas are partly caught by the demister 72. As a result, it is unnecessary for the cooling coil 73 to liquefy all the mist and the solvent vapor contained in the hot exhaust gas. In other words, the cooling load of the cooling coil 73 is lowered so as to make it possible to increase the cooling effect. Incidentally, it is possible to use, for example, a metal mesh having a predetermined aperture diameter as the demister 72.

The hot exhaust gas passing through the demister 72 enters the cooling coil 73. The cooling coil 73 is constructed such that a coolant flows within a pipe. For example, it is desirable for the cooling coil 73 to be constructed such that a large number of fins are formed on the surface, the pipe is bent complex, and that a plurality of straight pipes are arranged in parallel in order to enlarge the surface area of the pipe. Since the hot exhaust gas is brought into contact with these fins and the surface of the pipe, the solvent vapor contained in the hot exhaust gas is liquefied so as to drop by its own weight onto the demister 72 and further drop onto the bottom portion of the process chamber 81 together with the solvent vapor liquefied in the demister 72.

It is possible for the coolant supplied to the cooling coil 73 to be a liquid such as water or oil, or a gas such as a substitute Freon gas, as far as the surface of the pipe is cooled by the coolant. If the temperature of the coolant circulated within the cooling coil 73 is lowered, the recovery efficiency of the solvent vapor is increased so as to make it possible to recover even a solvent having a low boiling point. Therefore, it is possible to arrange separately a heat exchange apparatus such as a chiller so as to lower the temperature of the coolant. On the other hand, it is also possible to supply an industrial water or a city water directly into the cooling coil 73 without using a chiller or the like.

It is desirable to determine the temperature and the flow rate of the coolant supplied to the cooling coil 73 in view of the kind and the boiling point of the solvent to be recovered, which is contained in the hot exhaust gas, and in view of the temperature, the flow rate, and the like of the hot exhaust gas. Also, it is possible to maintain the required cooling capability in the cooling coil 73 by increasing the flow rate of the coolant supplied to the cooling coil 73 in the case where the coolant temperature is high or by decreasing the flow rate of the coolant in the case where the coolant temperature is low.

In the present invention, it is desirable to use the cooling apparatus 70 constructed such that an industrial water or a city water is used as the coolant, and the surface of the pipe is cooled by supplying the cooling water by using a circulating apparatus such as a pump. It is desirable to keep a minimum flow rate of the cooling water circulated within the cooling apparatus 70 even under the state that the cooling apparatus 70 is not operated because the continuous cooling water circulation permits suppressing the bacteria generation. An in-port 78 and an out-port 79 for circulating the cooling water within the cooling coil 73 are arranged in the cooling apparatus 70 shown in FIG. 5.

The exhaust gas passing through the cooling coil 73 flows through a gas passageway 82 and an exhaust pipe 83 arranged within the cooling apparatus 70 into a plant piping 91 connected to the exhaust pipe 83. Incidentally, the plant piping 91 is no more than an example. It is possible for the exhaust gas passing through the exhaust pipe 83 to be connected to other facilities for the waste gas disposal. Since the exhaust gas is cooled within the cooling coil 73, the temperature of the exhaust gas is scarcely lowered further. Also, it is possible to avoid the situation that the temperature of the plant piping 91 is rendered lower than the temperature of the exhaust gas as passed through the cooling coil 73 by lowering the temperature of the coolant supplied to the cooling coil 73 in view of the ambient temperature under which the plant piping 91 is arranged or in view of the outer temperature.

The solvent vapor contained in the exhaust gas, which was not recovered in the cooling apparatus 70, is not liquefied within the plant piping 91 so as to be removed by, for example, a scrubber (not shown) arranged in the plant piping 91 as in the prior art, with the result that it is possible to discharge a clean exhaust gas to the outside.

For example, in the pre-bake after the resist coating step using a polyimide series resist, NMP (normal methyl pyrrolidone) contained in the resist solution as a solvent is evaporated. However, since NMP is a liquid under room temperature, it is sufficiently possible to recover NMP as a liquid by cooling the hot exhaust gas to about room temperature by supplying a city water or an industrial water, which need not be cooled by using a cooling apparatus such as a chiller, into the cooling coil 73. It follows that NMP is prevented from being liquefied and retained within the plant piping 91 so as to reduce the load in the maintenance of the plant piping 91 or the like. In addition, it is possible to suppress the corrosion of the piping material. In the case of using a city water or the like as the cooling water, an additional merit can be produced that the running cost can be suppressed to a low level.

Where the cooling water supplied to the cooling coil 73 is circulated without being forcedly cooled by, for example, a chiller in recovering NMP or the like from the hot exhaust gas as described above, it is desirable to monitor the flow rate and the temperature of the cooling water so as to prevent the temperature of the cooling water from being increased by the heat of the hot exhaust gas to exceed a predetermined level.

The mist attached to the demister 72 and the solvent liquefied in the cooling coil 73 drop by their own weight onto the bottom portion of the process chamber 81 so as to flow into a groove portion 74 and, then, to be stored and recovered in the recovery tank 77 through a drain 75. It is possible to process the solvent recovered in the recovery tank 77 for the reuse. It is possible for a valve 76 to be held open during the normal operation and to be closed when the recovery tank 77 is replaced. Alternatively, it is also possible to keep the valve 76 closed during the normal operation and to be opened when a predetermined amount of the solvent is stored in the groove portion 74 and in the bottom portion of the process chamber 81 so as to recover the solvent in the recovery tank 77.

It should be noted that the solvent vapor leaking from the recovery tank 77 is sucked by a suction port 83a formed in the exhaust pipe 83 so as to be guided into the plant piping 91. It follows that the atmosphere within the space in which is arranged the recovery tank 77 is kept clean so as to prevent corrosion of various parts arranged in the particular space. It is also possible to improve the safety in the operation for replacing the recovery tank 77.

The method using the recovery tank 77 is on the premise that the recovery tank 77 is manually operated for the replacement. However, the recovery method of the solvent liquefied by the demister 72 and the cooling coil 73 is not limited to the method using the recovery tank 77. For example, a cooling apparatus 70a shown in FIG. 6 is substantially equal in construction to the cooling apparatus 70, except that the cooling apparatus 70a comprises a water level sensor 93 mounted to the side wall of the process chamber 81, and that a waste liquid pipe 92 is arranged in place of the recovery tank 77.

Figure 6:
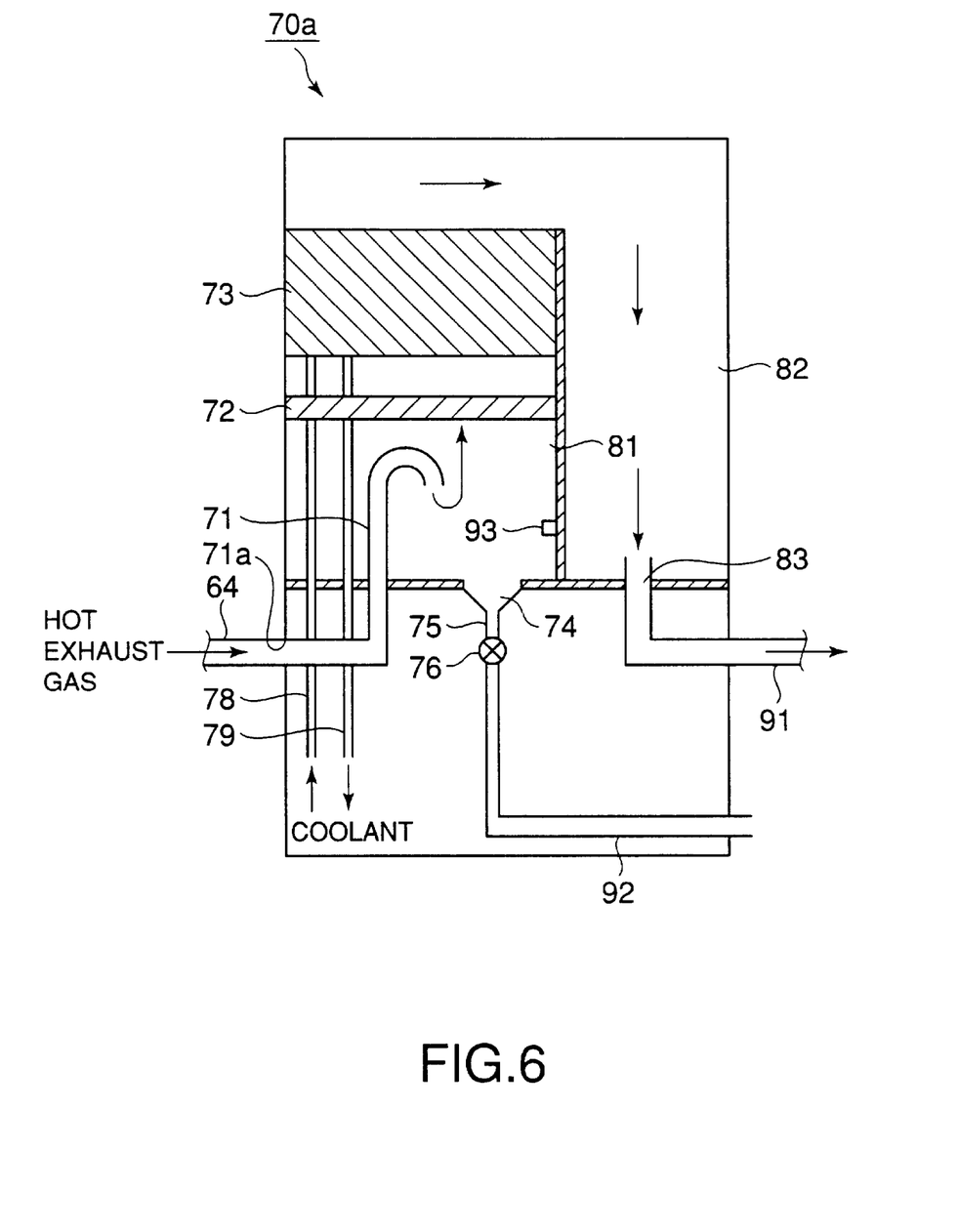
FIG. 6 is a cross sectional view showing the construction of a cooling apparatus according to another embodiment of the present invention.

In the cooling apparatus 70a shown in FIG. 6, it is possible to keep, for example, the valve 76 open so as to permit the liquefied solvent or the like dropping from the demister 72 and the cooling coil 73 onto the bottom portion of the process chamber 81 to flow into a recovery apparatus (not shown) or a waste disposal apparatus (not shown) arranged on the outside through the waste liquid pipe 92 for the disposal of the liquefied solvent or the like. It is possible to construct the cooling apparatus 70a such that, where the liquefied solvent remains within the process chamber 81 because of, for example, the clogging of the waste liquid pipe 92, the residence of the liquefied solvent in the process chamber 81 is detected by the water level sensor 93 and an alarm is generated so as to stop as required the operation of the cooling apparatus 70a.

It is also possible to keep the valve 76 closed during the normal operation such that the liquefied solvent dropping onto the bottom portion of the process chamber 81 is stored in the process chamber 81 and, when the water level sensor 93 detects the state that the liquefied solvent stored in the process chamber 81 has reached a predetermined liquid level, the valve 76 is opened. It is also possible to permit the liquefied solvent stored in the bottom portion of the process chamber 81 to flow into a recovery apparatus (not shown) or a waste liquid disposal apparatus (not shown) arranged on the outside through the waste liquid pipe 92 in this case, too, for the disposal of the liquefied solvent.

If the waste liquid is recovered from the waste liquid pipe 92 to, for example, a large tank in the case of arranging the waste liquid pipe 92, it is possible to mount a water level sensor to the large tank, too. In this case, it is possible to take measures to generate, for example, an alarm so as to prevent the overflow of both the process chamber 81 and the large tank by feeding back the information as to whether it is possible to recover the liquefied solvent to the control device of the water level sensor 93 mounted to the cooling apparatus 70a. It follows that, in the case of mounting the waste liquid pipe 92, the automatic operation can be made possible.

It is possible to mount a small cooling apparatus 70 or 70a of the construction described above for each of the hot plate units (HP). It is also possible to mount a single cooling apparatus 70 or 70a for a plurality of hot plate units (HP) such that the cooling apparatus is used for only a predetermined treatment, e.g., for only the pre-bake treatment of the resist film. In this case, a single cooling apparatus 70 or 70a is mounted for each of the predetermined treatments. Further, it is possible to use a single cooling apparatus 70 or 70a for processing the hot exhaust gases discharged from all the hot plate units (HP).

In the former two cases, it is possible to recover a high purity solvent because the kind of the solvent vapor contained in the hot exhaust gas discharged from the hot plate unit (HP) is unchanged unless the processing solution used such as the resist solution is changed. On the other hand, in the last case, the vapors of the solvents used in the resist solutions and the various processing solutions such as the developing solution are cooled and condensed together, with the result that the recovered solvents are in the form of a mixed solution. In this case, the recovered solvent is low in purity. However, the construction of the cooling apparatus can be simplified so as to facilitate the maintenance operation.

Figure 7:
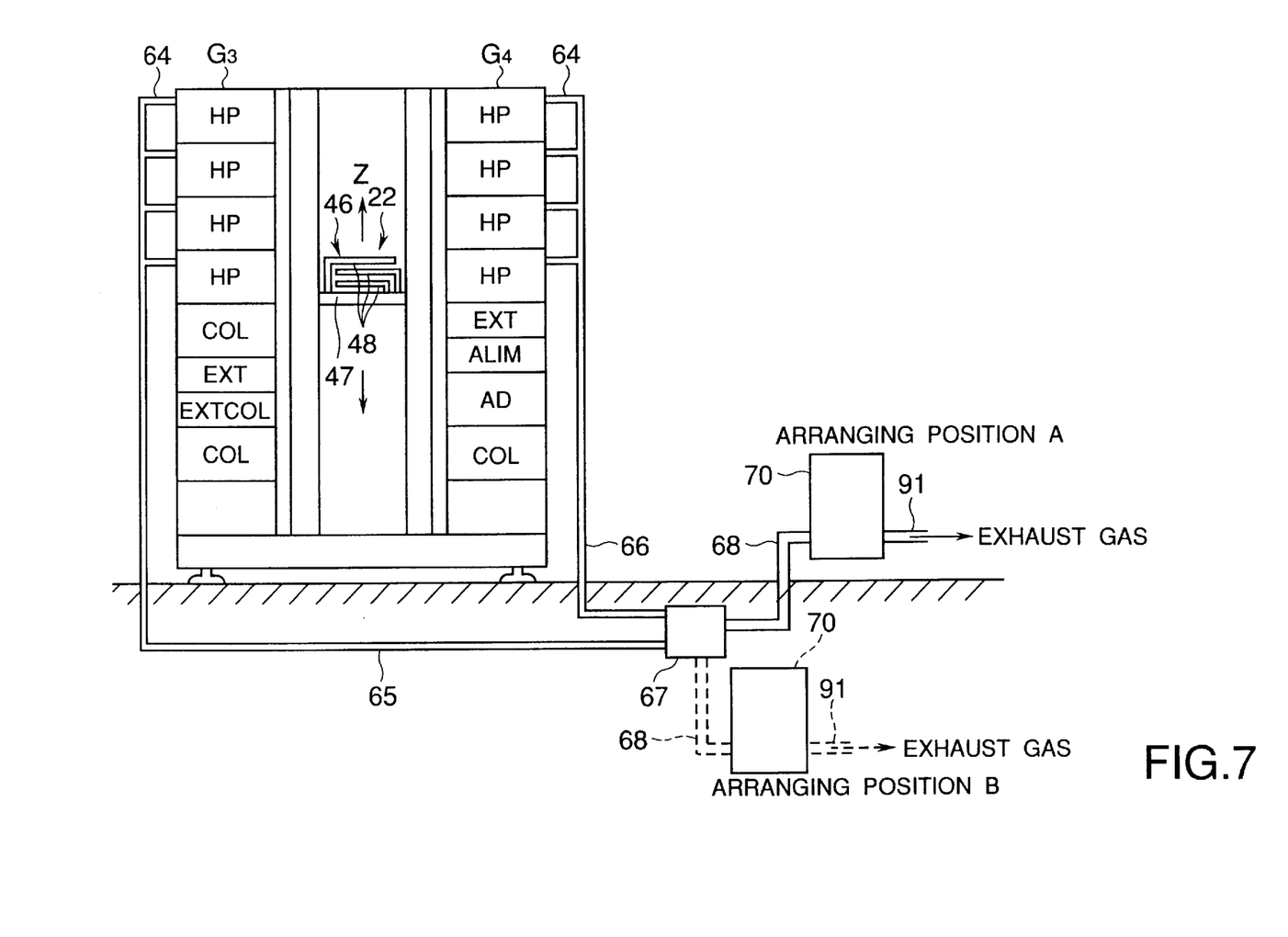
FIG. 7 is a side view showing the position where the cooling apparatus is arranged according to one embodiment of the present invention.

FIG. 7 shows an arrangement of the cooling apparatus 70 according to one embodiment of the present invention. As shown in the drawing, the hot exhaust gas discharged from all the hot plate units (HP) arranged in the third process section $G_3$ and the fourth process section $G_4$ flows through a single cooling apparatus 70 so as to be discharged into a plant piping 91. The detailed construction of the cooling apparatus 70 is omitted in FIG. 7.

The cooling apparatus 70 can be arranged in a suitable position in accordance with the arranging position of the resist coating-developing system. For example, the cooling apparatus 70 can be arranged in an arranging position A on the floor on which the resist coating-developing system is arranged or in an arranging position B below the floor on which the resist coating-developing system is arranged. There is no difference in the cooling performance of the hot exhaust gas and in the NMP recovery efficiency in the cooling apparatus 70 between these arranging positions A and B.

The exhaust pipes 64 of the four hot plate units (HP) arranged in the third process section $G_3$ are connected to a single exhaust pipe 65. Likewise, the exhaust pipes 64 of the four hot plate units (HP) arranged in the fourth process section $G_4$ are connected to a single exhaust pipe 66. These exhaust pipes 65 and 66 are connected to a joint box 67 to permit the hot exhaust gases flowing through these exhaust pipes 65 and 66 to be combined in the joint box 67. An exhaust pipe 68 is arranged between the joint box 67 and the cooling apparatus 70 such that the hot exhaust gas discharged from the hot plate units (HP) is transferred into the cooling apparatus 70 through the exhaust pipe 68.

Each of the exhaust pipes 65 and 66 has an inner diameter of, for example, 75 mm, and the exhaust pipe 68 has an inner diameter of, for example, 100 mm. On the other hand, it is desirable for each of the exhaust pipes 65 and 66 to have a length not larger than 3 meters and for the exhaust pipe 68 to have a length not larger than 10 meters so as to suppress the pressure loss.

Concerning the cooling apparatus 70, it is desirable for the cooling water supplied into the cooling coil 73 to have a temperature falling within a range of between 15° C. and 23° C. and for the flow rate of the hot exhaust gas flowing into the cooling apparatus 70 to be not higher than 3 m³/min. Where the hot exhaust gas flowing into the cooling apparatus 70 has a temperature of 40° C., it is desirable to control the cooling capability of the cooling apparatus 70 to permit the exhaust gas discharged from the cooling apparatus 70 to have a temperature not higher than 25° C. Under these conditions, it is possible to remove NMP sufficiently from the hot exhaust gas.

Figure 8:
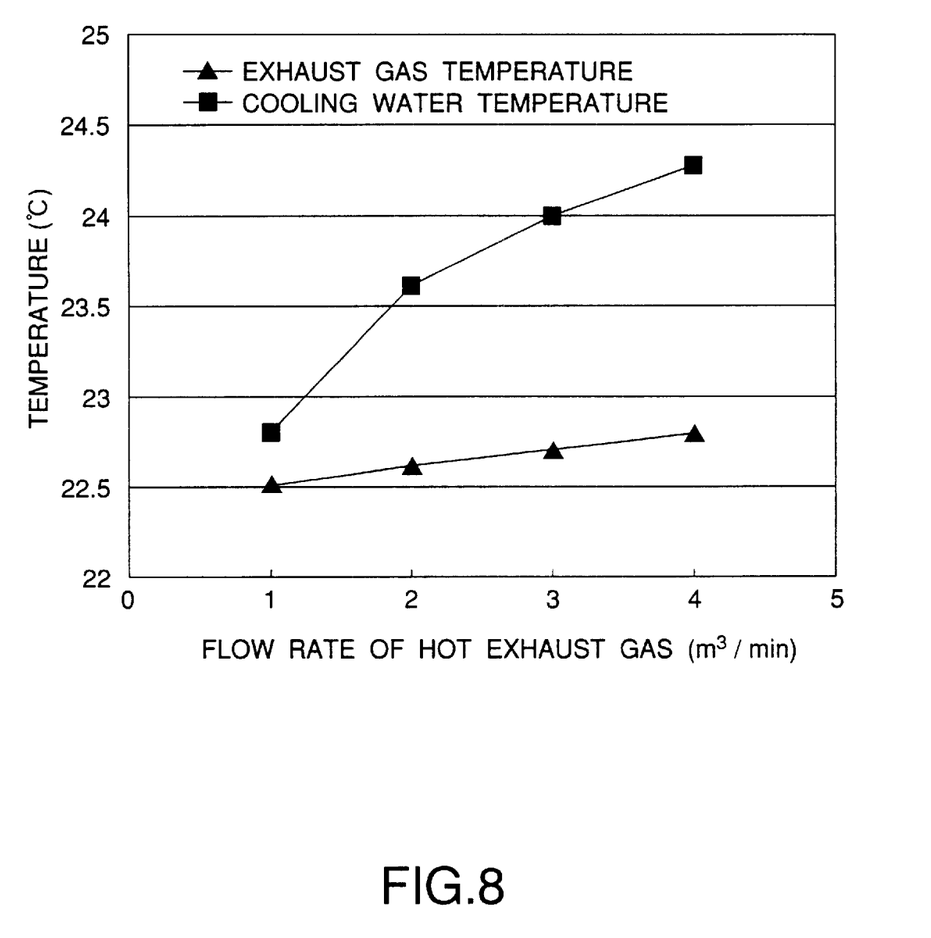
FIG. 8 is a graph showing as an example the cooling performance of the cooling apparatus arranged at the position shown in FIG. 7.

FIG. 8, which is a graph exemplifying the cooling performance of the cooling apparatus 70, shows the relationship between the flow rate of the hot exhaust gas flowing into the cooling apparatus 70 and the temperature of the exhaust gas discharged from the cooling apparatus 70 and the relationship between the flow rate of the hot exhaust gas flowing into the cooling apparatus 70 and the temperature of the cooling water discharged from the cooling coil 73, covering the case where the temperature of the hot exhaust gas flowing into the cooling apparatus 70 was 40° C. and the temperature of the cooling water supplied into the cooling coil 73 was set at 21° C. Incidentally, the ambient temperature at the site of arranging the cooling apparatus 70 was 23° C. and the flow rate of the cooling water was 3L/min.

As apparent from FIG. 8, the temperature change of the cooling water discharged from the cooling coil 73 is larger than the temperature change of the exhaust gas discharged from the cooling apparatus 70. Also, the temperature change of the exhaust gas discharged from the cooling apparatus 70 is small relative to the change in the flow rate of the hot exhaust gas flowing into the cooling apparatus 70. In other words, a heat exchange with the hot exhaust gas flowing into the cooling apparatus 70 is performed sufficiently in the cooling apparatus 70. The vapors of the solvents such as NMP, which are contained in the hot exhaust gas, can be separated and removed substantially completely in the cooling apparatus 70 by using the cooling apparatus 70 exhibiting the particular cooling performance.

In the description given above, NMP is exemplified as a solvent. However, it is also possible to use IPA, pure water, etc. as the solvent. To be more specific, it is possible to mount the cooling apparatus 70 or 70a for cooling the hot exhaust gas containing the vapors of various solvents such as the thinner coated on the wafer W before the wafer W is coated with the resist solution and the washing solution such as the pure water or IPA used for washing away the developing solution used in the developing treatment after the light exposure step so as to liquefy and remove the vapors of the solvents and, thus, to permit the exhaust gas with the decreased content of the solvent vapor to flow into the plant piping 91, thereby suppressing the corrosion of the plant piping and thus, prolonging the life of the plant piping. Also, it is possible to mount the cooling apparatus 70 or 70a even in the case where the component that is unlikely to be liquefied in the plant piping 91 is contained in the hot exhaust gas discharged from the hot plate unit (HP). It follows that the solvents discarded in the past can be recovered as resources.

Figure 9:
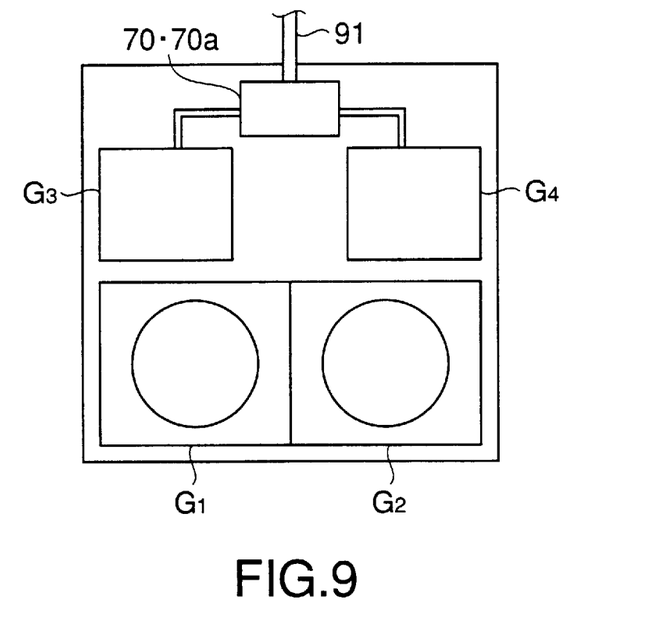
FIG. 9 is a plan view showing the arranging position of the cooling apparatus according to another embodiment of the present invention.
Figure 10:
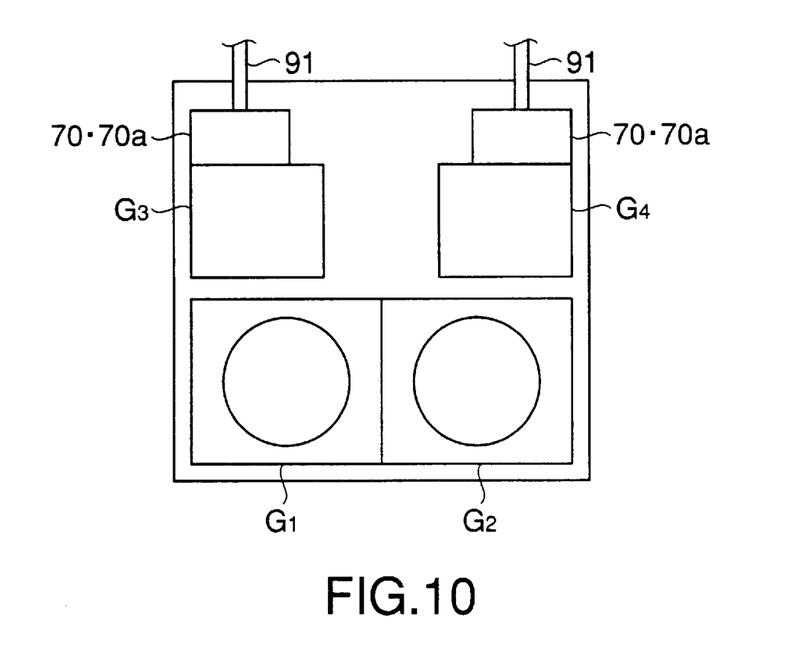
FIG. 10 is a plan view showing the arranging position of the cooling apparatus according to still another embodiment of the present invention.

The arranging position of the cooling apparatus 70 or 70a is not limited to the position shown in FIG. 7. For example, FIG. 9 is a plan view showing in a simplified fashion a part of the resist coating-developing system 1 shown in FIG. 1. Where the fifth process section $G_5$ shown in FIG. 1 is not arranged, it is possible to arrange the cooling apparatus 70 or 70a in, for example, the position of the fifth process section $G_5$. Also, as shown in FIG. 10, which is a plan view, it is possible to arrange the cooling apparatus 70 or 70a in that portion of the resist coating-developing system 1 which is positioned contiguous to and behind the third or fourth process section $G_3$ or $G_4$ in which the hot plate units are arranged.

In FIG. 7 described previously, the cooling apparatus 70 is arranged as a separate mechanism outside and behind the resist coating-developing system 1. However, where the arranging space of the cooling apparatus 70 or 70a is limited, it is possible to employ a cooling apparatus 70b shown in FIG. 11. In this case, an exhaust pipe 71' communicating with the exhaust pipe 64 and an exhaust pipe 83' communicating with the plant piping 91 are mounted to the bottom wall of the cooling apparatus 70b, and the cooling apparatus 70b of the particular construction is mounted contiguous to the side wall of the resist coating-developing system 1, as shown in the drawing.

Figure 11:
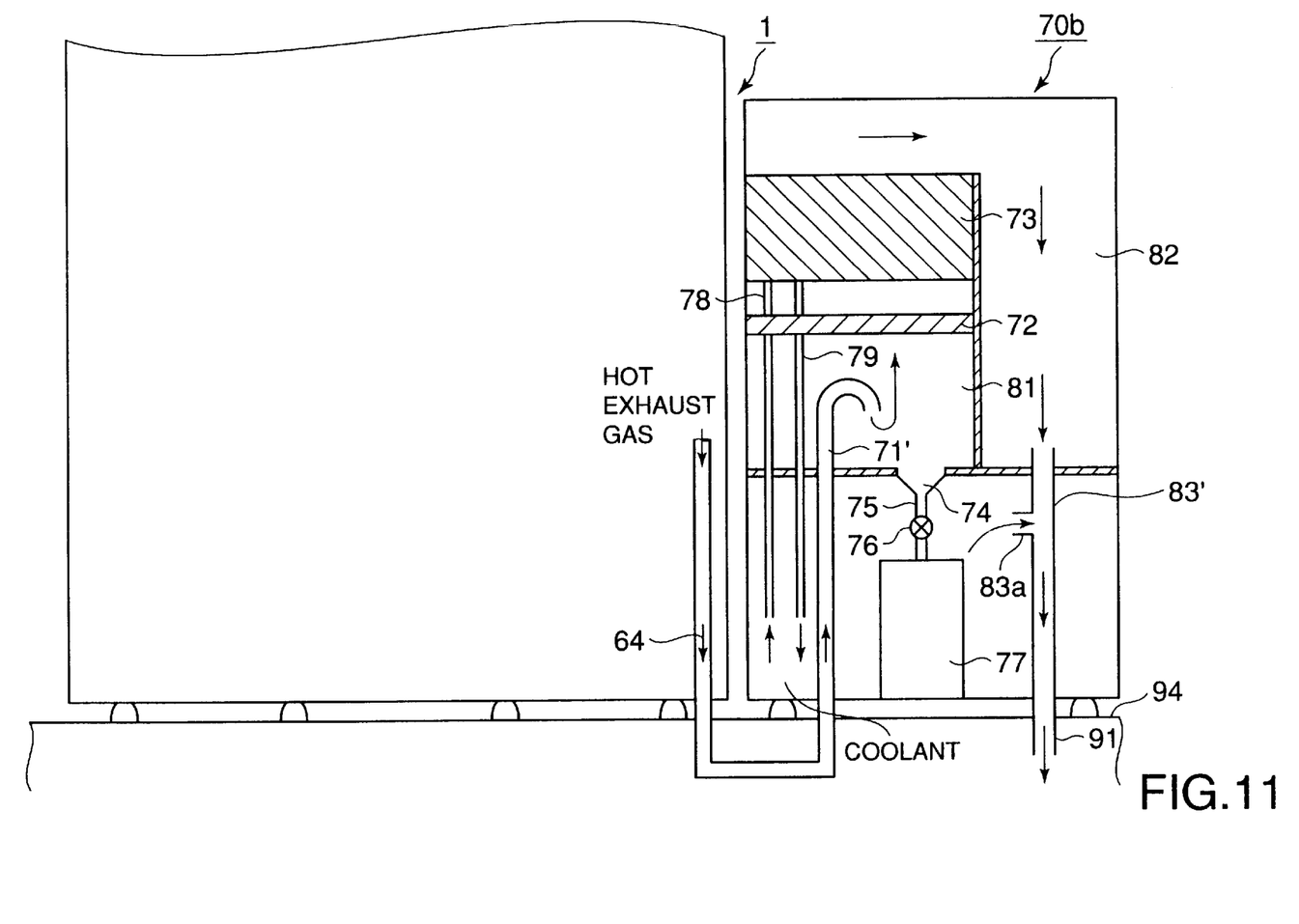
FIG. 11 is a cross sectional view showing the construction of a cooling apparatus according to still another embodiment of the present invention.

In the case of employing the cooling apparatus 70b, the exhaust pipe 64 is taken out from the bottom wall of the resist coating-developing system 1 toward a floor surface 94 so as to communicate with the exhaust pipe 71', thereby allowing the hot exhaust gas to flow into the process chamber 81. Also, the plant piping 91 is mounted to the bottom wall of the cooling apparatus 70b so as to permit the plant piping 91 to communicate with the exhaust pipe 83', thereby allowing the exhaust gas passing through the cooling coil 73 to be guided to the plant piping 91 through the exhaust pipe 83'.

In the case of employing the cooling apparatus 70b, it is possible to arrange the resist coating-developing system 1 and the cooling apparatus 70b close to each other so as to effectively utilize the arranging space of the apparatus. It should be noted, however, that, in the case of employing the cooling apparatus 70b, it is necessary to fold the exhaust pipe 64, leading to a large pressure loss, compared with the case of employing the cooling apparatus 70 or 70a. It is also possible for the liquefied solvent vapor contained in the hot exhaust gas to be retained in the folded portion of the exhaust pipe 64. It follows that, in the case where it is absolutely necessary to decrease the pressure loss and to prevent the liquefied solvent from being retained in the exhaust pipe 64, it is desirable to employ the cooling apparatus constructed such that the exhaust pipe 64 is connected to the side wall of the cooling apparatus like the cooling apparatus 70 or 70a.

In each of the embodiments described above, the apparatus and method of the present invention for the coating treatment are applied to an apparatus applying a resist coating treatment and a drying treatment to a semiconductor wafer. However, the technical idea of the present invention can be widely applied to an apparatus in which the process solution and the solvent contained in the process solution are evaporated by the drying. For example, it is possible to apply the technical idea of the present invention to an apparatus for applying a resist coating treatment and a pre-bake treatment to an LCD substrate, an apparatus for washing various substrates and for performing the drying with an organic solvent such as IPA, and an apparatus for applying a developing treatment as well as the washing and drying treatments after the developing treatment to various substrates.

Each of the embodiments described above is simply intended to clarify the technical idea of the present invention. Naturally, the present invention should not be limited to these embodiments for interpreting the technical scope of the present invention. It is possible to modify the present invention in various fashions within the spirit of the present invention and the technical scope defined in the accompanying claims.

What is claimed is:

1. An apparatus for coating treatment, in which a substrate is coated with a predetermined process solution, followed by applying a heat treatment to the resultant coating, comprising:

a coating section for coating the substrate with a process solution;

a heating section for heating the substrate coated with said process solution; and a recovery section for recovering at least a part of the solvent vapor contained in the hot exhaust gas discharged from said heating section, wherein said recovery section includes a cooling apparatus for cooling and liquefying said solvent vapor for recovery of liquefied solvent, wherein said cooling apparatus includes a process chamber for cooling and condensing mist and vapor contained in the hot exhaust gas discharged from said heating section for separating said mist and vapor in the form of a liquid, an inlet pipe for introducing said hot exhaust gas into said process chamber, a gas passageway through which flows the exhaust gas after separation of the mist and vapor therefrom within said process chamber, an exhaust pipe communicating with said gas passageway for discharge of the exhaust gas to the outside, and a liquid recovery chamber for recovering the liquid condensed in said process chamber.

2. The apparatus for the coating treatment according to claim 1, wherein said inlet pipe projects upward from a bottom portion of the process chamber and is, then, bent downward so as to permit the hot exhaust gas to be discharged downward.

3. The apparatus for the coating treatment according to claim 1, wherein said exhaust pipe extends through said liquid recovery chamber and a suction port for sucking the atmosphere gas within the liquid recovery chamber is formed in a part of the exhaust pipe within the liquid recovery chamber.

4. The apparatus for the coating treatment according to claim 1, wherein said hot exhaust gas discharged from said heating section is guided into said cooling apparatus through a side wall of said cooling apparatus.

5. The apparatus for the coating treatment according to claim 1, wherein said hot exhaust gas discharged from said heating section is guided into said cooling apparatus through a bottom wall of the cooling apparatus.

6. The apparatus for the coating treatment according to claim 1, further comprising a water level sensor mounted to the process chamber for detecting the liquid amount within the process chamber.

7. The apparatus for the coating treatment according to claim 1, wherein said liquid recovery chamber includes a drain extending through a bottom wall of the process chamber, a drain opening-closing valve mounted to an intermediate portion of said drain, and a liquid recovery tank detachably mounted to said drain.

8. The apparatus for coating treatment according to claim 1, wherein said recovery section includes an apparatus for processing or recovering a waste liquid arranged separately from said cooling apparatus, and said liquid recovery chamber includes a drain extending through a bottom wall of said process chamber, said drain serving to process or recover said waste liquid recovered in said process chamber.

9. An apparatus for coating treatment, in which a substrate is coated with a predetermined process solution, followed by applying a heat treatment to the resultant coating, comprising:

a coating section for coating the substrate with a process solution;

a heating section for heating the substrate coated with said process solution; and a recovery section for recovering at least a part of the solvent vapor contained in the hot exhaust gas discharged from said heating section, wherein said recovery section includes a cooling apparatus for cooling and liquefying said solvent vapor for recovery of liquefied solvent, wherein said cooling apparatus includes a demister for removing the mist contained mainly in the hot exhaust gas and a cooling coil for cooling and condensing the vapor contained in the hot exhaust gas for liquefying the vapor.

10. The apparatus for the coating treatment according to claim 1, wherein said process chamber further includes a demister for removing the mist contained mainly in the hot exhaust gas and a cooling coil for cooling and condensing the vapor contained in the hot exhaust gas for liquefying the vapor, the hot exhaust gas introduced into the process chamber passing first through said demister and, then, through said cooling coil.

11. The apparatus for the coating treatment according to claim 9, wherein said cooling coil uses water as a coolant.

12. The apparatus for the coating treatment according to claim 9, wherein said cooling coil uses a coolant cooled by a chiller.

13. The apparatus for the coating treatment according to claim 11, wherein water cooled by a chiller is circulated through said cooling coil.

14. A method for coating treatment, in which a substrate having a surface coated with a predetermined process solution is arranged within a heating device for subjecting said substrate to a heat treatment within the heating device, comprising passing a hot exhaust gas containing a solvent vapor, which is generated from said process solution on the substrate when the substrate is arranged within said heating device, through a cooling apparatus such that at least a part of the solvent vapor contained in said exhaust gas is recovered as a liquid,     wherein said hot exhaust gas is passed first through a demister and, then, through a cooling coil such that the solvent vapor is condensed and liquefied.

15. A method for coating treatment, in which a substrate having a surface coated with a predetermined process solution is arranged within a heating device for subjecting said substrate to a heat treatment within the heating device, comprising passing a hot exhaust gas containing a solvent vapor, which is generated from said process solution on the substrate when the substrate is arranged within said heating device, through a cooling apparatus such that at least a part of the solvent vapor contained in said exhaust gas is recovered as a liquid,     wherein an amount of the liquid recovered in said cooling apparatus is detected by a sensor, and an alarm is generated when the amount of the recovered liquid exceeds a predetermined level.

16. A method for coating treatment, in which a substrate having a surface coated with a predetermined process solution is arranged within a heating device for subjecting said substrate to a heat treatment within the heating device, comprising passing a hot exhaust gas containing a solvent vapor, which is generated from said process solution on the substrate when the substrate is arranged within said heating device, through a cooling apparatus such that at least a part of the solvent vapor contained in said exhaust gas is recovered as a liquid,     wherein an amount of the liquid recovered in said cooling apparatus is detected by a sensor and, when the amount of the recovered liquid exceeds a predetermined level, the recovered liquid is transferred into a liquid storing apparatus or a liquid processing apparatus arranged outside the cooling apparatus.

17. An apparatus for coating treatment, in which a substrate is coated with a predetermined process solution, followed by applying a heat treatment to the resultant coating, comprising:

a coating section for coating the substrate with a process solution;

a heating section for heating the substrate coated with said process solution; and     a recovery section for recovering at least a part of the solvent vapor contained in the hot exhaust gas discharged from said heating section, wherein said recovery section includes a cooling apparatus for cooling and liquefying said solvent vapor for recovery of liquefied solvent,     wherein said cooling apparatus includes a demister for removing the mist contained mainly in the hot exhaust gas and a cooling coil for cooling and condensing the vapor contained in the hot exhaust gas for liquefying the vapor,     wherein said cooling coil uses water as a coolant, and     wherein water cooled by a chiller is circulated through said cooling coil.

* * * * *